United States Patent [19]

Medvedieff

[11] Patent Number: 5,201,985
[45] Date of Patent: Apr. 13, 1993

[54] METHOD AND APPARATUS FOR THE PURIFICATION AND CONTROL OF THE COMPOSITION OF NON-STOICHIOMETRIC AND STOICHIOMETRIC CRYSTALLINE COMPOUNDS

[75] Inventor: Serge Medvedieff, Boston, Mass.

[73] Assignees: Harald A.T.O.; Irene B. Reiche, both of Boston, Mass.

[21] Appl. No.: 667,601

[22] Filed: Mar. 7, 1991

[51] Int. Cl.$^5$ ............................................. C30B 23/00
[52] U.S. Cl. ..................................... 156/609; 156/610; 156/DIG. 72; 156/DIG. 111; 156/DIG. 113; 252/62.3 GA
[58] Field of Search ............... 156/609, 610, DIG. 72, 156/DIG. 111, DIG. 113; 252/62.3 GA

[56] References Cited

U.S. PATENT DOCUMENTS 4,190,486  2/1980  Kyle ............................ 156/DIG. 72
4,507,160  3/1985  Beck et al. .................. 156/DIG. 72
4,613,495  9/1986  Gentile et al. .............. 156/DIG. 72

OTHER PUBLICATIONS

*Crystal Growth*; 2nd ed; vol. (16); Pamplin; pp. 13–15. 1.6 "Vapor Phase Growth".
*Crystallization*; 1st sted. (Chapter 8) (1972); Mullin; pp. 284–290.
*Compound Semiconductors*; (vol. 1) Willardson et al; pp. 86–87; "Preparation of III–V compounds".
"Epitaxial Layers of Cadmium Sulfide with an Excitation Spectrum", V. N. Martynov et al., Inorganic Materials, 16, 1182, Oct. 1980.
"Exciton Structure of Absorption, Photoluminescence, and Photonconductivity Spectra of Epitaxial Layers of Cadmium Sulfide on Sapphire", V. N. Martynov et al., Sov. Phys. Crystallog., 24, 6, Nov.-Dec. 1979.
"Photoconductivity and Photoluminescence of p-Type Cadmium Telluride", V. N. Martynov et al., Sov. Phys. Crystallogr., 24, 6, Nov.-Dec. 1979.
"Growth of CdTe Crystals from Solution-Melts and Investigation of Their Properties" S. A. Medvedev et al., Neorganicheskie Materialy, 8, 1210, Jul. 1972.
"Nature of Point Defects In Undoped CdTe", S. A. Medvedec et al., Neorganicheskie Materialy, 9, 356, Mar. 1973.
"Intrinsic Point Defects in Undoped CdTe", S. A. Medvedev et al., Sov. Phys. Crystallogr. 28, 3, May-Jun. 1983.

*Primary Examiner*—Robert Kunemund
*Assistant Examiner*—Felisa Garrett
*Attorney, Agent, or Firm*—Choate, Hall & Stewart

[57] ABSTRACT

This invention relates to a method for purification of non-stoichiometric crystalline compounds by cycling said compound through successive steps of sublimation and crystallization. Purification can be accomplished by providing a vacuum chamber containing a cavity at the entry end, the exit end of which is open to the ambient. The vacuum chamber is charged at the entry end with the compound to be purified and the vacuum chamber is sealed at the exit end with a cap provided with a cooling finger for the eventual condensation of the purified compound. The compound to be purified is then heated under a vacuum in the vacuum chamber. A local temperature gradient is provided in the cavity of the vacuum chamber which moves slowly down the cavity. Successive acts of sublimation of the compound to be purified occur at the rear (hot side) of the temperature gradient and successive acts of crystallization occur at the front (cool side) of the temperature gradient, thus realizing large scale elimination of impurities and approaching a composition of the point $P_{min}$.

19 Claims, 2 Drawing Sheets

METHOD AND APPARATUS FOR THE PURIFICATION AND CONTROL OF THE COMPOSITION OF NON-STOICHIOMETRIC AND STOICHIOMETRIC CRYSTALLINE COMPOUNDS

BACKGROUND OF THE INVENTION

This invention relates to the technology of non-stoichiometric crystalline compounds and the method for their purification by simultaneously eliminating residual impurities and controlling the composition of non-stoichiometric compounds possessing high vapor pressures at and below their melting points and the construction of an apparatus therefor.

The technological processes developed for the production of semiconductor materials now used for the fabrication of semiconductor devices (silica, germanium, gallium arsenide, etc.) such as zone melting and growing single crystals from the melt cannot be used for the processing of non-stoichiometric compounds possessing high vapor tensions well below their melting points, such as the semiconductor compounds of general formulas $A^{II}B^{VI}$, $A^{IV}B^{VI}$, etc. Although the method described here uses the well-known non-stoichiometric compound $A^{II}B^{VI}$ by way of example, it can be used for the purification of very different compounds possessing high vapor tension in the solid state including crystalline stoichiometric organic compounds.

A crystalline compound $A_nB_m$ is stoichiometric only if, upon sublimation, the vapor molecules do not dissociate, i.e., if the sublimation process can be described using the notation introduced by Kröger by the reaction $$(n\ A_A + m\ B_B)_S \rightarrow A_nB_m(v) \tag{1}$$

Applying the mass action law, we have $$P_{A_nB_m} = K(T) \tag{2}$$

In this case, the compound behaves like any elemental crystal, and it is impossible to add to (or to remove from) the compound atoms of its constituents in a proportion different from the ratio of the number of sites normally occupied in the crystal lattice of the stoichiometric compound.

Most generally the vapor phase resulting from the sublimation of crystalline compounds consists of the products of the dissociation of the molecules $A_nB_m$ and the process of sublimation is described by a reaction such as

$$P_A{}^n \cdot P_B{}^m = K_2(T) \tag{4}$$

For the compounds $A^{II}B^{VI}$ we have $$P_A \cdot P_B^{\frac{1}{2}} = K_2(T) \tag{5}$$

as the vapor phase contains atoms A and molecules $B_2$.

In this case the composition of the crystal $A_nB_m$ can be modified by heating it in a closed space where a definite pressure of one of its constituents is established. The ratio of sites occupied by the atoms in the crystal lattice can be modified by diffusing in it vacancies or interstitial atoms. By means of this procedure it is possible, in principle, to obtain a given non-stoichiometric composition (i.e., at a given concentration of point defects). However, this is by no means practical, as the process of diffusion proceeds very slowly and cannot eliminate the residual impurities always present in any crystal.

As the vapor phase of practically all inorganic compounds $A_nB_m$ always contains products of the dissociation of the molecules $A_nB_m$, the problem of controlling their properties is that of being able to purify them and of achieving precision-control of their composition. The strictly stoichiometric composition could be attained only if the energies of formation of the point defects on both of the sub-lattices A and B were equal. As a rule, however, they are different.

The necessity to control precisely the concentration of point defects follows from the fact that in these compounds the point defects do ionize like the impurities incorporated in their lattices. Consequently, the physical and physicochemical properties of the semiconductor compounds strongly depend upon the concentrations of the point defects and of the residual impurities. In a typical compound $A^{II}B^{VI}$, the extent of the domain of existence is of the order of $10^{-3}-10^{-2}$ atomic percents and the concentration of ionized point defects may be $10^{19}/cm^3$. The partial vapor pressures of the constituents depend largely on the concentration of the point defects and may vary by a factor of $10^6$. This latter point is crucial for the technological processes of purification or crystal growing.

Whatever the purity of the constituents and the procedure of synthesis, it is practically impossible to insure the reproduction of the composition and hence that of the properties. At any temperature there are only three compositions of the crystalline compounds that can be precisely reproduced. Two are those that correspond on the $T-x$ phase diagram to the two borderlines of the existence domain. The third is that which corresponds on the $P-x$ diagram to the composition of minimum pressure. Compositions of the first and second type result in the greatest concentrations of point defects at the temperature considered; and when ionized (at least at room temperature and above) the point defects determine the type and the value of the electrical conductivity and have the greatest ratio of partial pressures of the constituents.

A crystalline compound having the composition of the point $P_{min}$ at a given temperature is characterized by the fact that the equilibrium compositions of the solid and vapor phases are equal (congruent sublimation). The composition of the point $P_{min}$ does not coincide with stoichiometry as the smallest difference between the energies of formation of the defects on the sub-lattices A and B lead to a displacement of the minimum of free energy of the phases in equilibrium towards the side where the energy of formation is the least. By heating a compound of arbitrary composition under conditions such that the vapor freely leaves the surface of the solid, the composition of the compound crystallizing at a lower temperature will be richer in constituent B with lower energy of formation, i.e., nearer to the point $P_{min}$, and the vapor richer in constituent A, as the free energy correspondingly diminishes. The minimum of the total pressure $P = P_A + P_{B2}$ is observed when $$\frac{dP}{dP_A} = \frac{dP}{dP_{B2}} = 0, \text{ namely because} \tag{6}$$

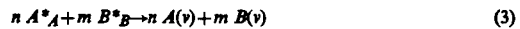

The position of the point $P_{min}$ and its displacement with temperature are dependent upon the nature of the point defects and the presence of residual and doping impurities.

Consequently, to produce materials with definite properties, it is necessary to have a technological process that can bring the composition (i.e., the concentration of point defects) of the compounds to that corresponding to $P_{min}$ and to purify them (i.e., to remove most of the impurities) at the same time.

The present invention concerns the construction of an apparatus realizing simultaneously the large-scale elimination (to a level below $10^{-5}-10^{-6}$ atomic %) of the impurities and the reproducible purification of non-stoichiometric compounds to approach the composition defined as the point $P_{min}$. The method of purification described below can be used to process materials on the kilogram scale.

SUMMARY OF THE INVENTION

The method according to the invention includes the purification of non-stoichiometric crystalline compounds by cycling the compound through a great number of sublimation and crystallization steps during which non-volatile impurities are removed by sedimentation and the volatile components, excessive with respect to the composition $P_{min}$, are eliminated by diffusion through the vapor phase.

Purification is accomplished by providing a vacuum chamber containing a cavity at the entry end, the exit end of which is open to the ambient. The vacuum chamber is charged at the entry end with the compound to be purified and the vacuum chamber is sealed at the exit end with a cap provided with a cooling finger for the eventual condensation of the purified compound. The compound to be purified is then heated under a vacuum in the vacuum chamber. A local temperature gradient is provided in the cavity of the vacuum chamber which moves slowly down the cavity. Successive acts of sublimation of the compound to be purified occur at the rear (hot side) of the temperature gradient and successive acts of crystallization occur at the front (cool side) of the temperature gradient, thus realizing large scale elimination of impurities and approaching a composition of the point $P_{min}$.

The non-stoichiometric compound to be purified by this method has a high vapor pressure below its melting point or decomposition temperature. In a preferred embodiment, the non-stoichiometric compound is selected from the group of II-VI and IV-VI semiconducting compounds. Examples of suitable non-stoichiometric compounds include, but are not limited to, ZnSe, CdSe, CdTe, CdS, ZnS, PbTe and PbSe.

In another preferred embodiment, means are provided to seal and unseal the exit end of the vacuum chamber using gasketing, ground glass or threaded joints or by flame sealing. In yet another embodiment of this invention, the vacuum chamber is treated prior to use by etching of the inner surfaces to remove any surface impurities. In yet another embodiment of this invention, the furnace used for heating the vacuum chamber contains two independently powered sections, R' and R", so that the length of R' is substantially equal to that of length of the cavity. The temperature of R" can be 50-150 K. greater than that of R'. The evacuation and heating of R' and R" are adjusted so that the vapor pressure of the compound to be purified is maintained at $10^{-4}-10^{-7}$ torr.

A local temperature gradient can be supplied using a small heater and a gas cooling system attached to a hollow rod. The small heater locally raises the temperature 50-100 K., effecting the vaporization of a portion of the compound to be purified. In a preferred embodiment, the heater/cooling system moves at a rate of 5-40 cm/hr along the length of the cavity with sublimation and crystallization reactions proceeding down the furnace to the collection tube. Cooling in front of the heater is accomplished by means of a positive flow of cooling gas or natural convection. Many thousands of sublimation/crystallization cycles occur during this process.

Another aspect of this invention provides for the construction of an apparatus for the purification of non-stoichiometric compounds. In this embodiment of the invention, a vacuum chamber is formed by two coaxial tubes in which one end (entry end) is closed so as to form a cavity and the other end (exit end) is open to the ambient. An end cap with a cooling finger capable of collecting condensed purified compound is provided. The vacuum chamber is heated by a main furnace with two independently operated heating zones. A vacuum pump is provided which, in combination with the main furnace, is capable of maintaining a vapor pressure of the compound to be purified at $10^{-4}-10^{-7}$ torr. A heater/cooling system consisting of a small electrical resistance furnace on a hollow rod through which cooling gas is passed is centered in the cavity and is moved coaxially down the cavity by moving the rod with a suitable mechanism.

Another aspect of the present invention provides for purification of a crystalline organic, inorganic or organometallic compound having a high vapor pressure below its melting point or decomposition temperature according to the method of the invention.

The practice of this invention gives materials that are very pure ($<10^{-5}$ atomic %) and which have a composition of the point $P_{min}$. The photoluminescence spectra of several II-VI semiconducting compounds shows that initial spectra with many broad peaks are reduced after purification to a single peak with phonon replica corresponding to the energy gap of the compound.

DESCRIPTION OF THE PREFERRED EMBODIMENT

Central to this invention is a method in which a great number of sublimation-crystallization steps are carried out during which time the volatile impurities and the volatile component in excess with respect to the composition of $P_{min}$ are eliminated by the diffusion through the vapor phase. Non-volatile impurities take the form of atoms or of molecules formed with one of the constituents whose vapor pressures are much less than those of the constituents of the desired compound itself. They are subject to a sort of "sedimentation" within the solid deposit during its sublimation and are eventually absorbed on the surfaces of the tubes forming the vacuum chamber.

The efficiency of purification is maximized when only a small amount of material is processed at one time.

Yet the method and apparatus has been designed so as to allow for a sufficiently large output of purified materials.

Figure 1:
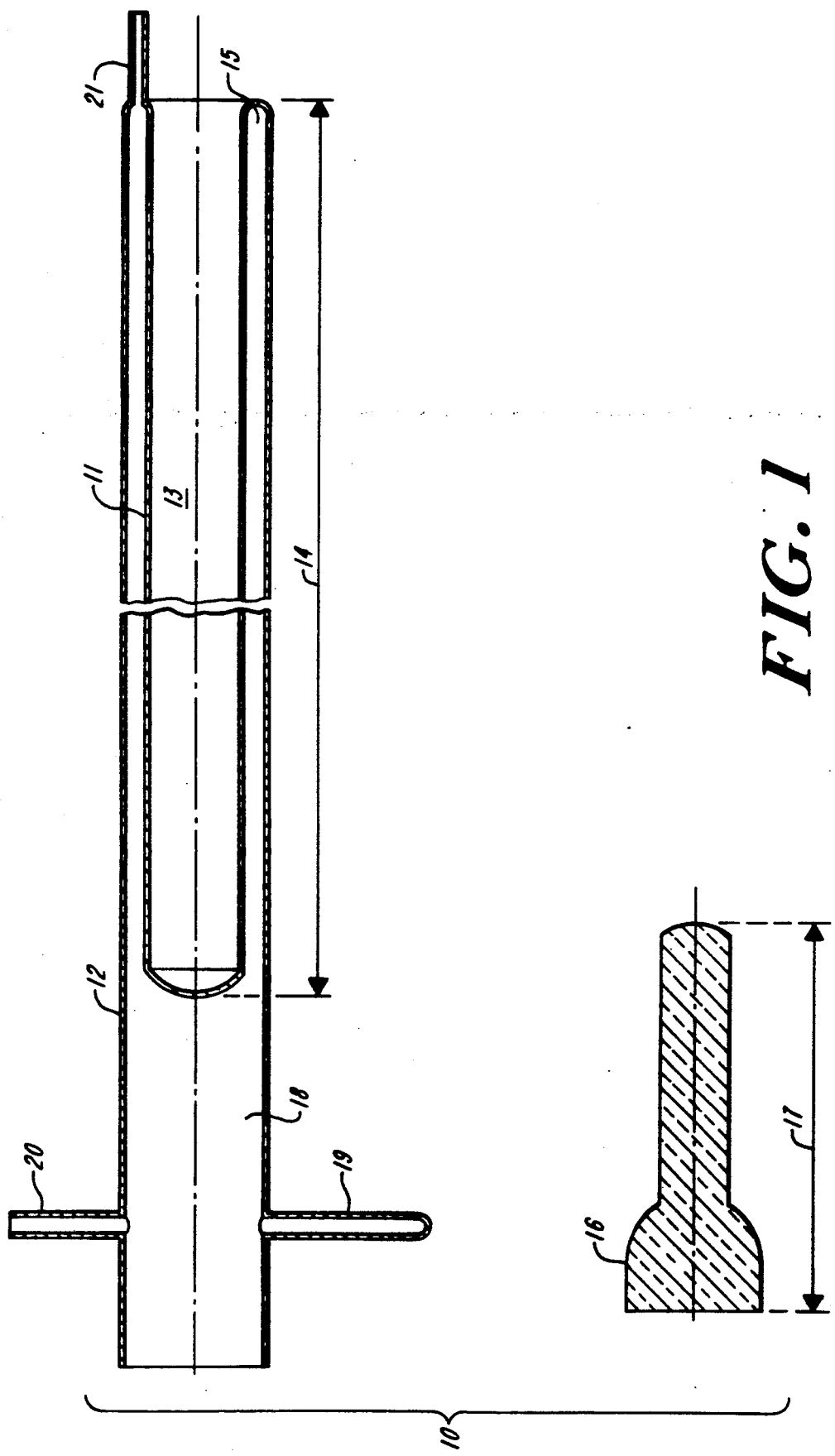
FIG. 1 is a cross-sectional view of the apparatus of the invention showing the vacuum chamber with cavity and the end cap with cooling finger.

The vacuum chamber used to practice this invention is shown in FIG. 1. Modifications to the apparatus will be readily apparent to those skilled in the art and are not meant to be excluded from the scope of the present invention.

A vacuum chamber 10 made up of two quartz tubes 11 and 12 arranged coaxially are sealed at one end (entry end) so that a cavity 13 of a length 14 is formed. The inner tube 11 is shorter than the outer tube 12 by about a quarter of its length. An inner space 15 in the vacuum chamber is formed where the compound to be purified is charged. After the opposite (or exit) end of the tube 12 is sealed with the aid of a quartz collector piece 16 of a length 17 (approximately one-quarter length 14), the space between the inner surfaces of the tubes 11 and 12 constitutes a vacuum chamber 18. Into the vacuum chamber 18 near its exit end there protrude a cryogenic pump 19 and a quartz tube 20 of smaller diameter for the evacuation of the chamber. At the entry end, another quartz tube 21 enters into the vacuum chamber for gas or plasma etching.

Figure 2:
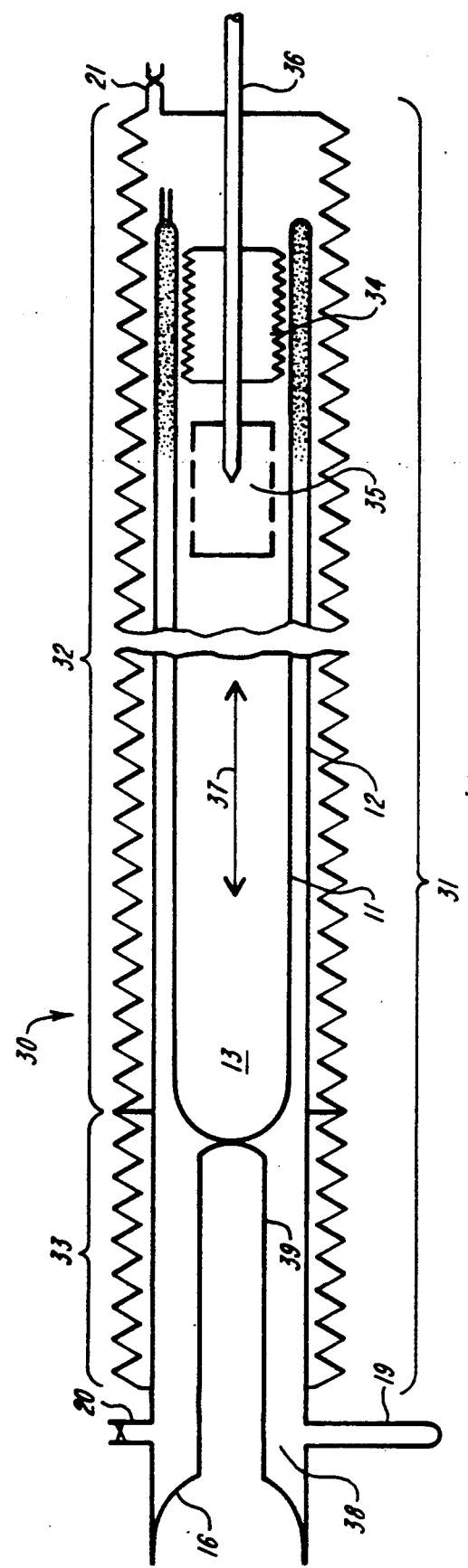
FIG. 2 is a cross-sectional view of the sealed purification apparatus charged with compound to be purified.

An apparatus 30 is fully assembled as shown in FIG. 2. An electric resistance furnace 31 with an inner diameter somewhat greater than the outer diameter of the tube 12 is supplied with two independently powered sections R' (32) and R'' (33). The length of section R' corresponds approximately to the length 14 of the inner tube 11, whereas the length of R'' is approximately equal to the distance between the sealed end of tube 11 and the location of the cryogenic pump 19.

A small electric resistance furnace 34 which can freely enter the cavity 13 is joined to a perforated tube 35 for gas cooling of the surface of tube 11 in front of the furnace 34. The assembly 34/35 is fastened to a motor-driven rod 36 and can be moved back and forth along the direction of an arrow 37 between the entry end and the end of tube 11. A mechanism is supplied (not shown) to move the assembly 34/35 at a speed of 5–40 cm/hr.

In order to ensure efficient purification by the sublimation-crystallization process, the apparatus must satisfy the following conditions:

(1) the space 15 between the coaxial tubes 11 and 12 must be sufficiently large so as to preclude any filling up of this space by the crystallized compound;

(2) the length of the coaxial conduit must be sufficiently great to allow many thousands of sublimation-crystallization steps to occur (0.5–4.0 m is preferred);

(3) the temperature gradient at the front end of the furnace 34 must, importantly, not be to steep in order to ensure a fast crystallization of the vapor and expedite the evacuation of volatile impurities and the excess constituent by reducing the quantity of vapor present at one time in the vacuum chamber (1–8 K./cm is preferred); and (4) the furnace 34 must be moved slowly to provide the initial extra heat needed to vaporize a portion of the charge (about 1/8–1/5) into the working part of a chamber 38. The vapor thus produced is then condensed on the cooled surface of the tube 11 in the form of a deposit. The motion of the furnace 34 within the cavity 13 provides the extra heating necessary to vaporize small quantities of the deposit. The vapor condenses on the inner surface of the quartz tube in front of the slowly moving furnace. In this way, the first portion of the charge, spread as a deposit, is moved progressively along the vacuum chamber toward the collector 39. The furnace is returned to the entry of the cavity, and a second portion of the charge is vaporized, condensed and subjected to purification; then a third; and so on until the entire charge has been purified.

Purification and control of the composition thus proceed apace during the many individual acts of sublimation and crystallization which at any given moment involve only a small quantity of matter. Sublimation of a small quantity of a given compound proceeds when the furnace which provides the requisite extra heating approaches the rear edge of the deposit. The vapor thus produced is then condensed on the inner surface of the inner tube in front of the furnace.

The efficiency of the method described is a function of the moving longitudinal temperature gradient, created by the displacement of the furnace and somewhat enhanced by the radial temperature gradient. It is the control of the magnitude of this gradient and the speed of its displacement which account for the efficiency of the process.

One of the most important features of the process is that it allows for the control of many parameters of the purification process thus, and of the control of the composition of the non-stoichiometric compound. The following parameter can and must be closely controlled:

(1) the quantity of the material subjected to purification in the course of a single run, that quantity being determined by the time needed for the extra heating of the initial charge;

(2) the number of acts of sublimation and crystallization to which a given mass is subjected, that number determined by the length of the work chamber and the length and magnitude of the temperature gradient created by the small furnace;

(3) the rise of the temperature determined by the small furnace and the speed with which the latter is displaced; and (4) the ratios of the temperatures provided by R' and R'' in the main furnace, both by itself and in conjunction with that provided by the small furnace.

In a preferred embodiment, the overall length of apparatus 30 was 300 cm; the diameter of the outer quartz tube 12 was 140 mm with a wall thickness of 4–6 mm; the diameter of the inner quartz tube 11 was 100 mm with a wall thickness of 4 mm and a length of 200 mm; the length of the closing cap 16 was 90 cm; and the diameter of the collector 39 was 70 mm.

The vacuum chamber was subjected to etching in order to remove any impurities on its inner surfaces (gas or plasma etching) before the exit end of the vacuum tube was sealed by the closing cap 16. After purging the etching gas with pure argon entering through tube 21 and maintaining a feeble flow of this gas, a known quantity of polycrystalline blocks (e.g.; 2 kg) was pushed into the far end of the vacuum chamber into space 25. The chamber was then sealed by fusing the closing cap 16 to its exit end. Next, tube 21 was sealed and the vacuum chamber was evacuated through tube 20 to a vacuum of $10^{-2}$–$10^{-3}$ torr. The tube 20 was then sealed and further vacuum was generated by the cryogenic pump 19. The apparatus was pushed into the furnace 31, the inner closed tube and charge being located in the section R' where the temperature was maintained at such a level that the total vapor pressure of the compound was less that $10^{-4}$–$10^{-7}$ torr. In the section R'' of the main furnace, the temperature may be higher by about 100 K in order to prevent any crystallization of the purified compound on the inner surface of tube 12. At the end of every unitary cycle, the purified compound was collected on the outer surface of the collector 39 fused to the closing cap 16. The inner surface of the collector 39 was cooled by a jet of gas or liquid. The volatile impurities and the extra component were gradually deposited on the walls of the vacuum chamber located outside the main furnace.

After the appropriate temperatures had been established in furnace sections R' and R'', the assembly composed of the small furnace 34 and the gas cooling system 35 was introduced into the cavity 13 and was fastened to the metallic rod driven with the aid of a convenient mechanism by an electric motor. This assembly 34/35 was carefully centered in order to raise and lower the temperature uniformly along the perimeter of the inner tube 11. The elevation of temperature provided by the furnace 34 was monitored during the course of the process and adjusted to maintain a vapor pressure of $10^{-4}$–$10^{-7}$ torr. The elevation of temperature was initially about 100 K and later by about 50 K, depending upon the nature of the compound being purified. The length of the furnace was about one-half the length of the charge. Therefore, by keeping the furnace physically beneath the first part of the charge for a known period of time, the vaporization of a desired portion of the charge occurred. The vapor crystallized on the inner surface of the tube 11 as it was cooled by the escaping gas from the perforated tube 35, i.e.; in the proximity of the charge. By setting the furnace in motion at a speed of 5–40 cm/hr, a succession of acts of sublimation occurred at the rear of the deposit and a succession of acts of crystallization occurred at the front of the deposit. The larger the number of these acts (many hundreds or thousands occurred on a path of 150 cm), the higher the purification to which the compound was subjected, and the closer its composition was approximated by that of the point $P_{min}$. For this composition at the temperature of collection of the purified compound, the ratio of the partial pressures of all compounds is approximately equal to two (congruent sublimation).

The contents of impurities (Cu, Al, Fe, Mg, Ag, Cr, Co, Bi, Ni, Mn, Pb, Sn, In, and Ti) in ZnSe, CdSe and CdTe was less than $10^{-5}$ atomic %. The study of photoluminescence spectra at 20 K showed that an initially large spectrum with many broad peaks was reduced after purification to a single peak with phonon replica corresponding to the energy gap of the compound.

What is claimed is:

1. A method of purification of a non-stoichiometric compound comprising the steps of:
   providing a vacuum tube under dynamic vacuum, said tube having a cooling region at an exit end closest to a vacuum source;
   charging the vacuum tube at an entry end opposite the exit end with a material to be purified;
   providing a temperature gradient movable along the length of the vacuum tube, a portion of the temperature gradient at a temperature sufficient to sublime the material to be purified and a portion of the temperature gradient at a temperature sufficient to condense the sublimed material, thereby subjecting the material to multiple sublimation and condensation steps as the material moves down the length of the vacuum tube towards the cooling region; and
   collecting a purified non-stoichiometric compound in the cooling region.

2. A method for purification of a non-stoichiometric compound comprising the steps of:
   providing a vacuum tube under dynamic vacuum, said tube having a cooling region at an exit end closest to the vacuum source;
   charging the vacuum tube at an entry end opposite the exit end with a material to be purified;
   providing a temperature unit having a cooling means and a heating means in thermal contact with the vacuum tube, the heating sufficient to sublime the material to be purified and the cooling sufficient to condense the sublimed material;
   moving the temperature unit along the length of the vacuum tube from the entry end towards the exit end, such that the cooling means precedes the heating means, thereby forming a local temperature gradient and causing sublimation of the material at the heating means and condensation of the material at the cooling means of the temperature unit and thereby subjecting the material to multiple sublimation and condensation steps as the material is transported down the length of the vacuum tube; and
   collecting a purified non-stoichiometric compound on the cooling region.

3. A method for purification of a non-stoichiometric crystalline compound comprising:
   providing a vacuum tube under dynamic vacuum comprising an inner and an outer tube positioned coaxial to one another, the exit end of the outer tube containing a cold finger and the inner and outer tubes joined together at an entry end and the inner tube sealed at its opposite end, thereby forming an interior space of the vacuum tube defined by the walls of the inner and outer coaxial tubes and thereby forming a cavity external to the vacuum tube, defined by the inner tube and in fluidic contact with the ambient;
   charging the entry end with a material to be purified;
   providing a temperature unit having a cooling means and a heating means in thermal contact with the vacuum tube and capable of axial motion within the cavity, the heating sufficient to sublime the material to be purified and the cooling sufficient to condense the sublimed material;
   axially moving the temperature unit down the cavity from a point near the entry end of the vacuum tube in a direction toward the cooling finger, such that the cooling means precedes the heating means, thereby forming a local temperature gradient and causing sublimation of the material at the rear (hot side) of the temperature gradient and condensation of the material at the front (cool side) of the temperature gradient and thereby subjecting the material to multiple sublimation and condensation steps as the material is transported down the length of the vacuum tube; and
   collecting a purified non-stoichiometric compound on the cooling finger.

4. The method of claim 1, 2 or 3 wherein said non-stoichiometric compound has a high vapor pressure below its melting point or decomposition temperature.

5. The method of claim 1, 2 or 3 wherein said non-stoichiometric compound is selected from the group comprising II-VI, IV-VI and III-V semiconducting compounds.

6. The method of claim 1, 2 or 3 wherein said non-stoichiometric compound is selected from the group comprising ZnSe, CdSe, CdTe, CdS, ZnS, PbTe and PbSe.

7. The method of claim 1, 2, or 3 wherein means is provided to seal and unseal the exit end from the vacuum tube.

8. The method of claim 1, 2, or 3 further comprising the step of:
    etching the inner surface of the vacuum tube subsequent to purging in order to remove any surface impurities.

9. The method of claim 2 or 3 wherein cooling means is selected from the group consisting of a positive flow of cooling gas and natural convection.

10. The method of claim 2 or 3 wherein the temperature unit moves at a speed of 5–40 cm/hr.

11. The method of 1, 2 or 3 wherein the temperature gradient is in the range of 1 to 8 K/cm.

12. The method of claim 3 wherein collection of purified compound at exit end of the vacuum tube is accomplished by flushing the cooling finger with a cooling fluid.

13. The method of claim 12 wherein the cooling fluid is a gas.

14. The method of claim 12 wherein the cooling fluid is a liquid.

15. The method of claim 13 further comprising:
    heating the entire vacuum tube prior to introducing the temperature unit, so that a vapor pressure of the material to be purified is maintained at $10^{-4}$–$10^{-7}$ torr.

16. The method of claim 15 wherein heating of the entire vacuum tube is accomplished by surrounding the vacuum tube with a resistance furnace.

17. The method of claim 15 wherein the heating of the entire vacuum tube is greater near the cooling finger than the remainder of the vacuum tube to prevent condensation of the purified compound on the walls of the vacuum tube near the cooling finger.

18. The method of claim 17 wherein heating of the entire vacuum tube is accomplished using two independently powered furnaces, R' and R", such that the length of R' is substantially equal to the length of the cavity and the length of R" is substantially equal to the length of the cold finger.

19. The method of claim 17 wherein the temperature at the cooling finger is 50–150 K higher than the temperature along the length of the cavity.

* * * * *

UNITED STATES PATENT AND TRADEMARK OFFICE
CERTIFICATE OF CORRECTION

PATENT NO. : 5,201,985
DATED : April 13, 1993
INVENTOR(S) : Serge Medvedieff

It is certified that error appears in the above-indentified patent and that said Letters Patent is hereby corrected as shown below:

```
On the title page, In the Title:
After "Method" please delete "and Apparatus".

Column 1, line 1: after "Method" please delete "and Apparatus"
```

Signed and Sealed this

Eighth Day of February, 1994

Attest:

BRUCE LEHMAN

*Attesting Officer*      *Commissioner of Patents and Trademarks*